United States Patent
Umeki et al.

(10) Patent No.: US 8,120,233 B2
(45) Date of Patent: Feb. 21, 2012

(54) PIEZOELECTRIC DEVICES AND METHODS FOR MANUFACTURING SAME

(75) Inventors: Mitoshi Umeki, Saitama (JP); Takahiro Inoue, Saitama (JP); Yoshiaki Amano, Saitama (JP); Takefumi Saito, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 133 days.

(21) Appl. No.: 12/592,910

(22) Filed: Dec. 3, 2009

(65) Prior Publication Data

US 2010/0133958 A1  Jun. 3, 2010

(30) Foreign Application Priority Data

Dec. 3, 2008 (JP) ................................. 2008-308366

(51) Int. Cl.
*H01L 41/047* (2006.01)
(52) U.S. Cl. .......................... 310/370; 310/363; 310/364
(58) Field of Classification Search .......... 310/363–366, 310/370
See application file for complete search history.

(56) References Cited

U.S. PATENT DOCUMENTS

2008/0129415 A1 * 6/2008 Iwai .............................. 333/188

FOREIGN PATENT DOCUMENTS

| JP | 2003-298386 | 10/2003 |
| JP | 2006-262456 | 9/2006 |

* cited by examiner

*Primary Examiner* — Derek Rosenau
(74) *Attorney, Agent, or Firm* — Klarquist Sparkman, LLP

(57) ABSTRACT

Methods are disclosed for manufacturing piezoelectric vibrating pieces and devices including such pieces. According to an embodiment of the method, a piezoelectric vibrating piece is produced from a piezoelectric wafer. To form the piece, a profile of the piezoelectric vibrating piece is formed in a piezoelectric wafer. A first metal film (chromium; Cr) is formed on the surface of the piezoelectric piece. The chromium film is surface-oxidized to form a film having Cr foundation layer and an oxidized surface. A second metal film (gold; Au) is formed on the oxidized surface. Then, in selected regions not destined to become electrodes, the second metal film is removed, leaving electrode patterns at designated regions of the piezoelectric vibrating piece.

8 Claims, 9 Drawing Sheets

PIEZOELECTRIC DEVICES AND METHODS FOR MANUFACTURING SAME

CROSS-REFERENCE TO RELATED APPLICATION

This application claims priority to and the benefit of Japan Patent Application No. 2008-308366, filed on Dec. 3, 2008, in the Japan Patent Office, the disclosure of which is incorporated herein by reference in its entirety.

FIELD

This disclosure relates to, inter alia, methods for manufacturing piezoelectric vibrating pieces and devices, more particularly to methods that prevent incidence of certain failures that occur in piezoelectric devices manufactured by conventional methods including sealing of through-holes and connecting electrodes electrically using a eutectic alloy. The techniques disclosed herein provide improved package configurations for piezoelectric vibrating elements that are surface mountable on piezoelectric substrates, including crystal substrates for example.

DESCRIPTION OF THE RELATED ART

With the progress of miniaturization and/or increases in the operating frequency of mobile communication apparatus and office automation (OA) equipment, piezoelectric vibrators and oscillators used in this equipment must be progressively smaller and/or operate at higher frequency. Also required are piezoelectric oscillators that can be reliably surface mounted (SMD: Surface Mount Device) on circuit boards and other printed substrates.

In certain conventional methods, tuning-fork type piezoelectric vibrating pieces are surface-mounted on a printed substrate. Conventional surface-mounting includes performing a reflow technique using lead-free solder to connect the vibrating piece electrically to the printed substrate. Unfortunately, this conventional reflow step (which involves heating) tends to result in diffusion of certain elements to and from the lead-free solder. For example, gold in a previously formed electrode film on the tuning-fork type vibrating piece can diffuse out of the electrode film. This out-diffusion can cause variability of the oscillation frequency of the vibrating piece. These diffusion phenomena also can arise during performance of conventional methods for packaging piezoelectric vibrating pieces to form corresponding piezoelectric devices.

Variations in vibration (oscillation) frequency arising during manufacture of piezoelectric devices are undesirable, especially variations that are not consistent. Conventionally, these variations become more pronounced with increased miniaturization of the piezoelectric devices. Consequently, new techniques are required to control these variations.

A conventional electrode film is formed on a piezoelectric vibrating piece as a double-metal layer, such as a gold layer formed on a chromium layer. As noted above, performing a reflow step can cause the gold in the electrode film to migrate out of the electrode, which causes undesired changes in oscillation frequency. One conventional approach to solving this problem is discussed in Japan Unexamined Patent Application No. 2003-298386. Specifically, the electrode film is formed with a main portion being made of chromium and with flanking portions being made of lead. A gold layer is formed in selected regions only if required for forming mounting pads and/or weights (e.g., on the distal ends of vibrating arms).

Another conventional approach is discussed in Japan Unexamined Patent Application No. 2006-262456, in which the electrode film is formed with a main portion being made of chromium and with flanking regions being made of lead. In addition, a protective film of silica ($SiO_2$) layered on top of these metal regions. Even though the chromium layer is treated to form an anti-oxidizing film thereon, the anti-oxidizing film can form an electrical short with other conductor ("wiring") elements, such as on the printed substrate. The silica layer formed on the anti-oxidizing film serves as a dielectric layer that prevents these shorts, which otherwise can cause oscillations of the piezoelectric vibrating piece to stop or substantially change from specification.

More specifically, the method discussed in the JP '386 reference involves forming respective portions of the electrode layers in separate steps. This requires use of two different masks during two separate respective sputtering or vacuum-deposition steps. Consequently, the JP '386 method requires at least one additional manufacturing step, which decreases productivity, increases manufacturing complexity, and increases cost. The method discussed in the JP '456 reference produces, for example, excitation electrodes on the vibrating arms, wherein the electrodes are comprised of only a chromium layer. Forming these electrodes only of chromium causes undesired increases in the CI value of the vibrating device and increases the difficulty of adjusting the oscillation frequency of the device.

Accordingly, it would appear that a desirable method would include forming the electrodes as a gold layer on a chromium "base" layer. But, a challenge is posed by the need for any step performed after forming the gold layer to leave the chromium layer intact. Conventional methods include heating steps, which causes chromium to diffuse into gold. Then, during a subsequent etching step directed at removing only lithography-selected regions of the gold layer (leaving behind the underlying chromium layer), the chromium that has diffused into the gold layer also is etched, which reduces the chromium in such regions to less than 10% of the initial amount of chromium. As a result, the chromium layer in the regions becomes very thin and tends to fracture, which disrupts its use as an electrical conductor.

In view of the above, an object of the invention is to provide, inter alia, simpler methods for manufacturing piezoelectric pieces and piezoelectric devices, wherein the methods reduce the incidence of fracture of conductors and improve the stability of oscillations or vibrations produced by the devices.

SUMMARY

A first aspect of the invention is directed to methods for manufacturing piezoelectric vibrating pieces from a piezoelectric wafer. An embodiment of the method comprises forming a profile of the piezoelectric vibrating piece in a unit of piezoelectric material. On at least one major surface of the profile, a first metal layer is formed that comprises at least one of Cr, Ni, Ti, Al, and W. Then, a surface of the first metal layer is oxidized. A foundation layer is formed that comprises at least one of Cr, Ni, Ti, Al, and W, on the oxidized surface of the first metal layer. On the foundation layer is formed a second metal layer comprising at least one of Au and Ag. An electrode pattern is formed on the first and the second metal layers; at a selected location on the profile, the second metal layer is removed to form the piezoelectric vibrating piece. In this method, selected regions of the second metal layer can be removed without removing corresponding regions of the oxidized first metal layer. Thus, after removing the second metal layer in the selected location(s), fracture of underlying conductor does not occur in the electrode pattern or elsewhere. In addition, the diffusion of metal from the eutectic material and/or caused by use of lead-free solder in conventional methods is avoided. Thus, piezoelectric vibrating pieces having stable characteristics are produced.

Forming the electrode pattern can comprises applying a film of photoresist on a surface of the second metal layer, performing a first exposure of the photoresist film to define the electrode pattern in the photoresist, performing a first removal of exposed photoresist to reveal regions of the second metal layer unprotected by photoresist, and, in regions unprotected by the photoresist, performing a first layer-removal step including etching through the first and second metal layers.

The first layer-removal step can comprise, at selected regions of remaining photoresist, performing a second exposure to define a desired shape in the photoresist. The exposed photoresist is removed. In regions unprotected by the photoresist, a second layer-removal step is performed including etching through at least the second metal layer. Then, the remaining photoresist is removed. Note that the second layer-removal step can be performed using the remaining photoresist. This allows the oxide film of the first metal film to be produced without adding extra manufacturing steps.

In certain method embodiments piezoelectric vibrating pieces are produced that comprise (a) a base having a proximal edge, a distal edge, and opposing side edges, (b) a pair of vibrating arms extending from the distal edge of the base, (c) a respective supporting arm extending from each side edge of the base outboard of the respective vibrating arm, and (d) an outer frame connected to the supporting arms and surrounding the base and vibrating arms, wherein the selected location on the profile includes at least a portion of the supporting arms. During mass-production of crystal frames having supporting arms and outer frames, if the oxide film of the first metal layer is formed on the supporting arms, it is possible to prevent diffusion of elements from the eutectic material used for sealing (e.g., through-holes) or from lead-free solder whenever a piezoelectric device is mounted on a printed substrate.

Other method embodiments produce piezoelectric vibrating devices in which the profile of the piezoelectric vibrating piece includes a base, a pair of vibrating arms, a pair of supporting arms, and an outer frame, wherein forming the electrode pattern comprises (i) forming excitation electrodes on the vibrating arms, (ii) forming extraction electrodes on the base, the supporting arms, and the outer frame, and (iii) forming connecting terminals on the outer frame, the connecting terminals being electrically connected to the extraction electrodes. The excitation electrodes and connecting terminals consist of the first and second metal layers, and remaining electrodes consist of the first metal layer and oxidized surface thereof.

According to another aspect, tuning-fork type piezoelectric vibrating pieces are provided. An embodiment of such a piece comprises a base having a proximal edge, a distal edge, and opposing side edges. A pair of vibrating arms extends in a longitudinal direction from the distal edge. Respective excitation electrodes are situated on the vibrating arms. A respective supporting arm extends, outboard of each vibrating arm, from each side edge of the base. The piece also includes an outer frame surrounding the base, vibrating arms, and supporting arms, wherein the supporting arms are connected to the outer frame. Extraction electrodes are situated on the base, the supporting arms, and the outer frame. The excitation electrodes and extraction electrodes comprise: (i) a first metal layer consisting of a metal selected from the group consisting of Cr, Ni, Ti, Al, and W, (ii) an oxide layer of an oxidized form of the metal of the first metal layer, (iii) a foundation layer consisting of a metal selected from the group consisting of Cr, Ni, Ti, Al, and W formed on the oxide layer, and (iv) a second metal layer consisting of a metal selected from the group consisting of Au and Ag formed on the foundation layer. The second metal layer is removed at designated loci on the extraction electrodes. Since the oxide film is formed on the first metal layer, whenever the second metal layer is removed at designated loci on the extraction electrodes, the first metal layer remains intact.

The outer frame portion can comprise connecting terminals that are electrically connected to the extraction electrodes, wherein the connecting terminals comprise at least the first and second metal layers.

The vibrating piece can further comprise connecting terminals situated on the outer frame, wherein the connecting terminals are electrically connected to the extraction electrodes at loci of the extraction electrodes lacking the second metal layer.

A tuning-fork type piezoelectric vibrating piece according to another embodiment comprises a base having a proximal edge, a distal edge, and opposing side edges. A pair of vibrating arms extends in a longitudinal direction from the distal edge. Respective excitation electrodes are situated on the vibrating arms. A respective supporting arm extends, outboard of each vibrating arm, from each side edge of the base. An outer frame surrounds the base, vibrating arms, and supporting arms, wherein the supporting arms are connected to the outer frame. Extraction electrodes are situated on the base, the supporting arms, and the outer frame. The excitation electrodes and extraction electrodes comprise: (i) a first metal layer consisting of a metal selected from the group consisting of Cr, Ni, Ti, Al, and W, (ii) an oxide layer of an oxidized form of the metal of the first metal layer, (iii) a foundation layer consisting of a metal selected from the group consisting of Cr, Ni, Ti, Al, and W formed on the oxide layer, and (iv) a second metal layer consisting of a metal selected from the group consisting of Au and Ag formed on the foundation layer. The second metal layer is removed at the connecting terminals and at loci on the extraction electrodes adjacent the connecting terminals.

According to yet another aspect, piezoelectric devices are provided that include a piezoelectric vibrating piece as summarized above, a lid bonded to a first surface of the outer frame, and a package base bonded to a second major surface of the outer frame. In these devices conductive "wiring" is situated between the excitation electrodes of the piezoelectric vibrating piece. Connecting electrodes connected to the excitation electrodes comprise a first metal (Cr, Ni, Ti, Al, or W). An oxide film is formed on the first metal layer. A foundation layer and a second metal layer are formed on the oxide film. Thus, whenever a region of the second metal layer film is removed by etching, the first metal film situated beneath the oxide layer is not removed or reduced in thickness. Also, whenever eutectic alloy is used in a reflow step for sealing of through-holes and the like, the gold component of the eutectic alloy does not diffuse to the excitation electrodes.

DETAILED DESCRIPTION

First Embodiment of Piezoelectric Device

Figure 1A:
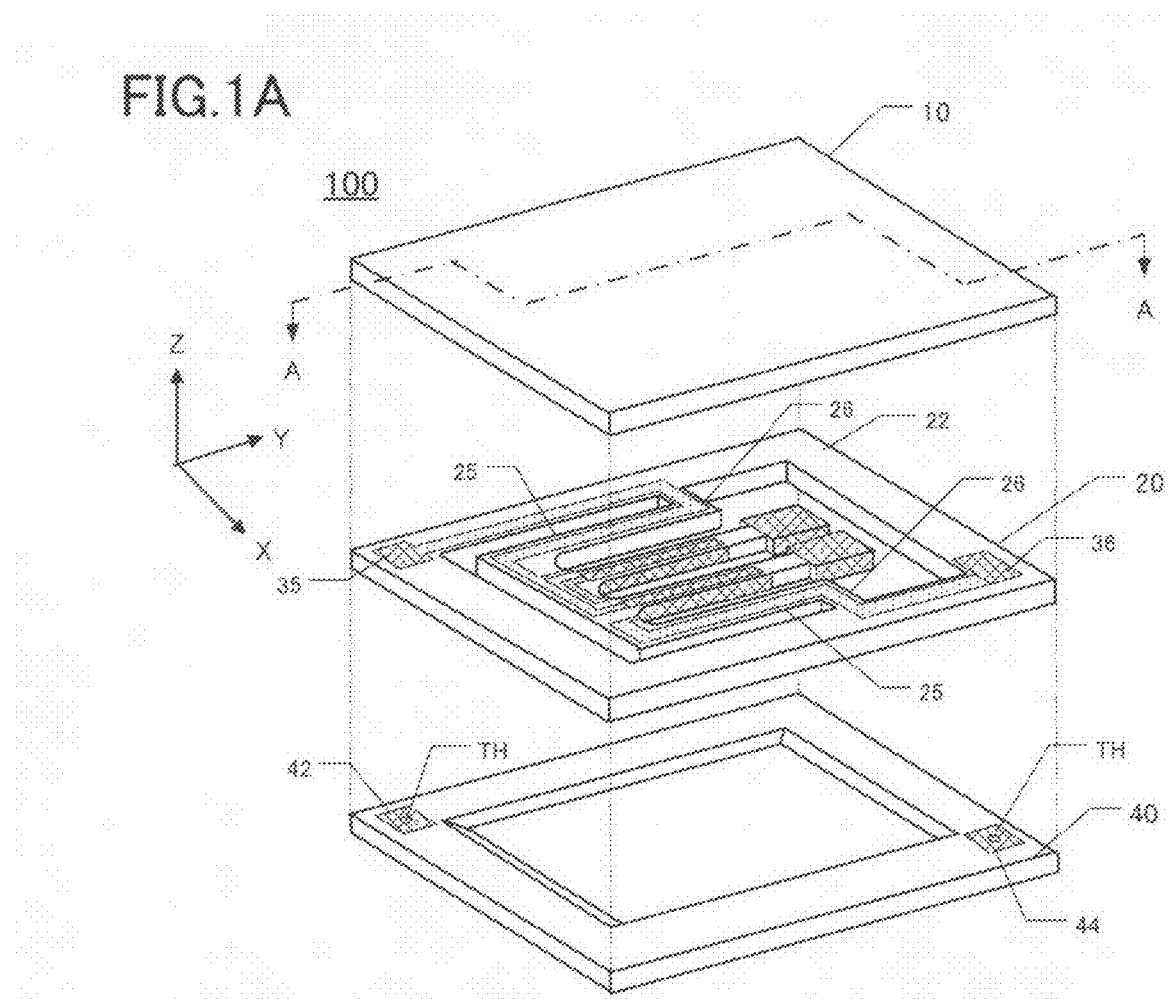
FIG. 1A is a perspective exploded view showing the alignment and stacking of layers to form a first embodiment of a piezoelectric device.
Figure 1B:
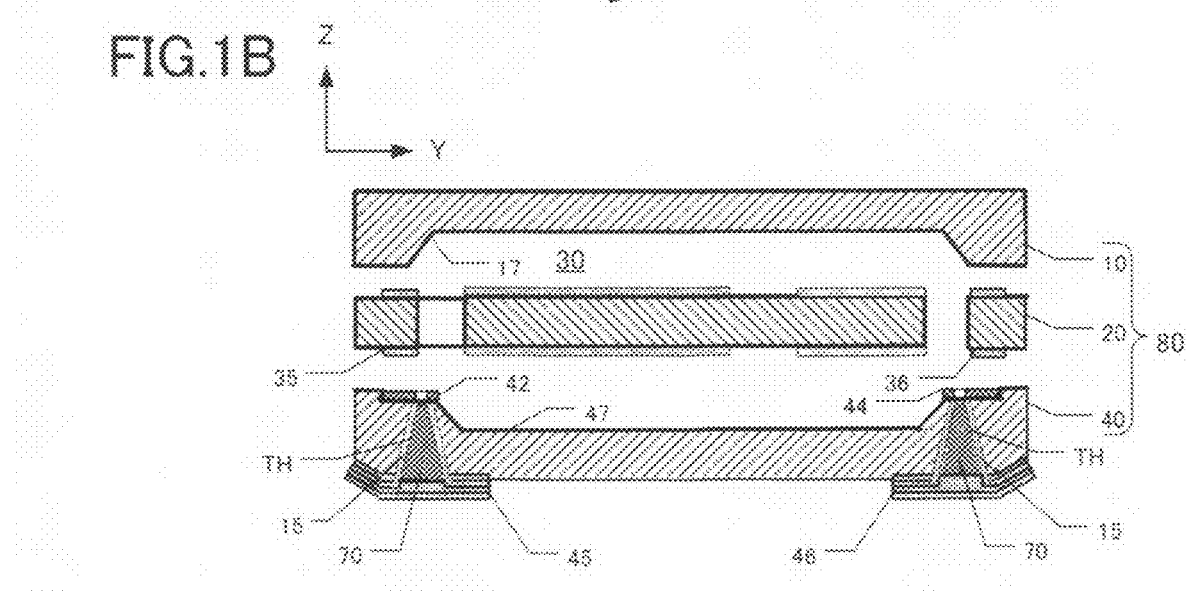
FIG. 1B is a elevational section, along the line A-A of FIG. 1A.

FIG. 1A is a perspective exploded view of a first embodiment of a piezoelectric device; FIG. 1B is a schematic elevational view along the line A-A in FIG. 1A. As shown in FIG. 1A, the piezoelectric device 100 comprises a package 80 comprising a lid 10, a piezoelectric crystal frame 20 including a tuning-fork type crystal vibrating piece 30, and a package base 40. The package base 40 includes a first external electrode 45 and a second external electrode 46, both situated on the under-surface of the package base. The tuning-fork type crystal vibrating piece 30 includes connecting portions 26 located at respective positions in which the vibrating arms 25 of the tuning-fork type crystal vibrating piece are connected to an outer frame portion 22 of the crystal frame 20. The piezoelectric crystal frame 20 includes first connecting terminals 35 and second connecting terminals 36 located in respective corners of each of the upper and lower surfaces of the outer frame portion 22.

As shown in FIG. 1B, the piezoelectric device 100 comprises the lid 10 and package base 40. The lid 10 has a concavity 17 on its under-surface (facing the crystal frame 20). The package base 40 defines a concavity 47 on its upper surface (facing the crystal frame 20) and also includes through-holes TH, a first connecting electrode 42, and a second connecting electrode 44. The first connecting electrode 42 is connected to the first external electrode 45, formed on the under-surface of the package base 40 via through-hole "wiring" 15 of the through-hole TH. The second connecting electrode 44 is connected to the second external electrode 46, formed on the under-surface of the package base 40 via through-hole "wiring" 15 of the through-hole TH.

The first and second connecting terminals 35, 36 located on the under-surface of the outer frame portion 22 are connected to the first connecting electrode 42 and the second connecting electrode 44, respectively, on the upper surface of the package base 40. Via the respective through-holes TH, the first connecting terminals 35 are electrically connected to the first external electrode 45, and the second connecting terminals 36 are electrically connected to the second external electrode 46.

The lid 10, piezoelectric crystal frame 20 including the tuning-fork type crystal vibrating piece 30, and the package base 40 constitute the first embodiment of a piezoelectric device 100. The lid 10 and package base 40 sandwich the crystal frame 20 (with the tuning-fork type crystal vibrating piece 30 located in the center), and these components 10, 20, 40 are bonded together. The package base 40 and lid 10 are bonded to the piezoelectric frame 20 by siloxane bonding (Si—O—Si). After performing siloxane bonding, eutectic alloy 70 (comprising gold and another metal) is added to fill the through-holes TH, and the device is placed in a vacuum reflow furnace (not shown) to melt the eutectic alloy 70 and cause the alloy to flow throughout the through-holes TH. Thus, the through-holes TH are sealed by the eutectic alloy 70, and manufacture of the package 80 is completed. Example eutectic alloys 70 are gold-germanium ($Au_{12}Ge$), gold-tin ($Au_{20}Sn$), and gold-silicon ($Au_{3.15}Si$). Although FIGS. 1A and 1B depict only one piezoelectric device 100, it will be understood that an actual manufacturing process can simultaneously produce hundreds or thousands of piezoelectric devices on a silicon wafer, wherein the silicon wafer is sandwiched between a lid wafer (having a corresponding number of lids) and a base wafer (having a corresponding number of package bases.

The first and second external electrodes 45, 46 shown in FIG. 1B comprise multiple metal-film layers that cover the eutectic alloy 70 after the through-holes TH have been filled with the eutectic alloy 70. However, it is not necessary to cover the through-holes TH with the metal-film layers.

First Embodiment of Piezoelectric Crystal Frame

Figure 2:
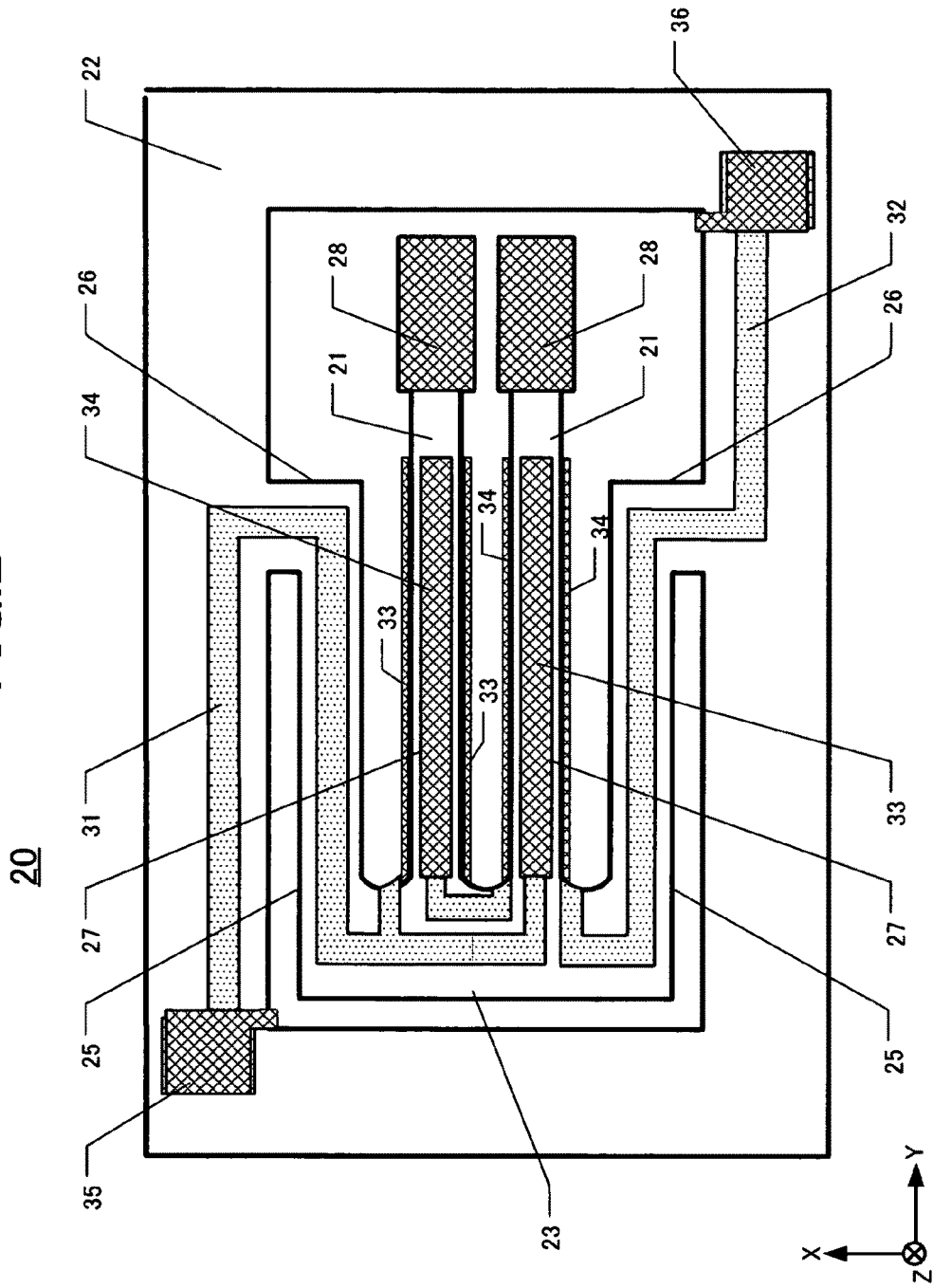
FIG. 2 is a plan view of the piezoelectric crystal frame of the first embodiment of a piezoelectric device.

FIG. 2 is a plan view of this embodiment of a piezoelectric crystal frame 20. The piezoelectric crystal frame 20 comprises a tuning-fork type crystal vibrating piece 30 that has a base 23 and vibrating arms 21 extending from the base. A crystal outer frame portion 22 includes a first extraction electrode 31, a second extraction electrode 32, supporting arms 25, and connecting portions 26. These features are all formed integrally with the same thickness. The tuning-fork type crystal vibrating piece 30 is configured to oscillate at, for example, 32.768 kHz, and thus is very small.

The vibrating arms 21 extend in the Y-direction from a distal edge of the base 23. The upper and lower major surfaces of the vibrating arms 21 each have one or more respective grooves 27. For example, one respective groove 27 is formed on each major surface of the vibrating arms, yielding a total of four grooves 27 on the vibrating arms 21. A cross-section of a vibrating arm 21 having grooves 27 on its upper and lower surfaces reveals a substantially H-shaped transverse profile. The H-shaped profile is effective in reducing the CI of the tuning-fork type piezoelectric vibrating piece 21. Although the depicted tuning-fork type crystal vibrating piece 30 has one groove 27 on each of the upper and lower major surfaces of the vibrating arms, each vibrating arm can have multiple grooves on each major surface, which may facilitate adjustments of vibration frequency.

The distal end of each vibrating arm 21 is wider than most of the rest of the vibrating arm, thereby producing a "hammerhead" profile. Each hammer-head includes a "weight" 28 comprising at least one metal film. The weights 28 make the vibrating arms 21 oscillate more easily whenever a voltage is applied and also facilitate stable oscillations.

A respective supporting arm 25 extends, outboard of each vibrating arm 21, from respective sides of the base in the same direction (Y-direction) as the vibrating arms 21 extend. The supporting arms 25 serve to, inter alfa, prevent leakage of oscillations from the vibrating arms 21 to the exterior of the piezoelectric device 100, and to reduce the probability of the piezoelectric vibrating piece being adversely affected by changes in exterior temperature or physical impacts.

The outer frame portion 22 is connected to the supporting arms 25 via the connecting portions 26. Each connecting portion 26 extends in the X-direction and has a width (in the Y-direction) that facilitates frequency adjustments. For example, the connecting portions 26 can be formed initially having greater width that can be narrowed (trimmed) after fabrication to achieve a desired vibrational frequency. This trimming can be performed using a femtosecond laser. Thus, a piezoelectric device 100 can be produced that retains the vibrational characteristics of the tuning-fork type crystal vibrating piece 30 incorporated into it.

The profile of the piezoelectric crystal frame 20 is formed from a crystal wafer using known photoresist etching techniques. Then, the electrodes are formed thereon by methods described below.

The first and second extraction electrodes 31, 32, respectively, are formed on the depicted upper major surface of the crystal frame 20 and extend from the outer frame 22 to the base 23, and through the supporting arms 25 and the connecting portions 26. The first and second connecting terminals 35, 36, respectively, are formed on both the upper surface and under-surface of the outer frame portion 22, just inboard of respective corners. The first and second connecting terminals are connected to the first and second extraction electrodes 31, 32, respectively.

First and second excitation electrodes 33, 34, respectively, are formed on the upper surface, under-surface, and both side surfaces of the respective vibrating arms 21. The first excitation electrode 33 is connected to the first connecting terminal 35, and the second excitation electrode 34 is connected to the second connecting terminal 36.

To form the first and second connecting terminals 35, 36, an oxidized film is formed on a first chromium (Cr) layer having a thickness in the range of 150 to 700 Ångstroms. A second chromium layer, thinner than the first, is formed on the surface of the oxidized film, and a gold (Au) layer is formed on the second chromium layer, at a thickness in the range of 400 to 2000 Ångstroms. As an alternative to either the first or second chromium layers, the respective layer can be a metal film of nickel (Ni), titanium (Ti), aluminum (Al), and/or tungsten (W). Also, a silver (Ag) layer can be used instead of the gold layer. The same film configuration is also used for forming the weights 28, the first excitation electrode 33, and the second excitation electrode 34.

The first and second extraction electrodes 31, 32, respectively, desirably comprise only the first chromium (Cr) layer, having a thickness in the range of 150 to 700 Ångstroms, and the oxidized film. An embodiment of a process for forming the first and second extraction electrodes 31, 32 is described later with reference to FIGS. 4 and 5.

When the through-holes TH are sealed with the eutectic alloy 70 during the reflow step, if the eutectic alloy 70 is made of gold-germanium (AuGe), the germanium component of the eutectic alloy 70 diffuses to the first and second connecting terminals 35, 36. In addition, the gold component of the gold layer formed on the first and second connecting terminals 35, 36 flows to the eutectic alloy 70.

If, according to conventional methods, the first and second extraction electrodes 31, 32 of the outer frame portion were made of a gold layer on a chromium layer, in the reflow step the germanium component of the eutectic alloy 70 would diffuse from the first and second connecting electrodes 35, 36 through the first and second extraction electrodes 31, 32 to the first and second excitation electrodes 33, 34. Also, the gold component of the first and second excitation electrodes 33, 34 would migrate to the eutectic alloy 70. As a result, upon completing the reflow step, the vibrational frequency of the device would be increased compared to the vibrational frequency produced before the reflow step. This represents an undesired frequency variability.

According to this embodiment, since the first and second extraction electrodes 31, 32 are comprised of only a first chromium layer and an oxidized film, diffusion of germanium and migration of gold are stopped because a gold layer does not exist on the extraction electrodes. Also, the germanium component of the eutectic alloy 70 does not diffuse to the first and second excitation electrodes 33, 34, and the gold component of the first and second excitation electrodes 33, 34 does not migrate to the eutectic alloy 70, thereby preventing a large frequency shift after the reflow step.

The excitation electrode and extraction electrode are formed on the piezoelectric crystal frame 20 using known photoresist etching techniques. After completion of the process steps described above, manufacture of the piezoelectric crystal frame 20 shown in FIG. 2 is completed.

Embodiment of Process for Manufacturing Piezoelectric Device 100

Figure 3:
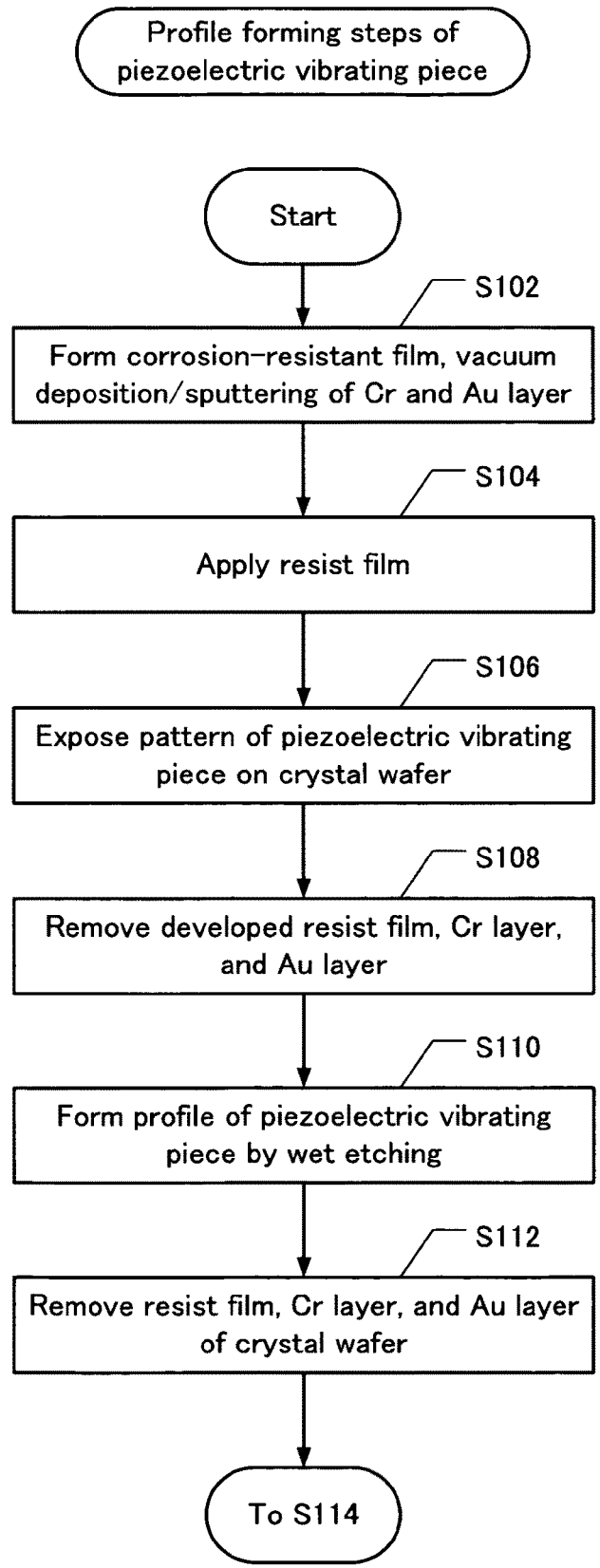
FIG. 3 is a flow-chart of profile-forming steps in an embodiment of a method for manufacturing a piezoelectric vibrating piece.
Figure 4:
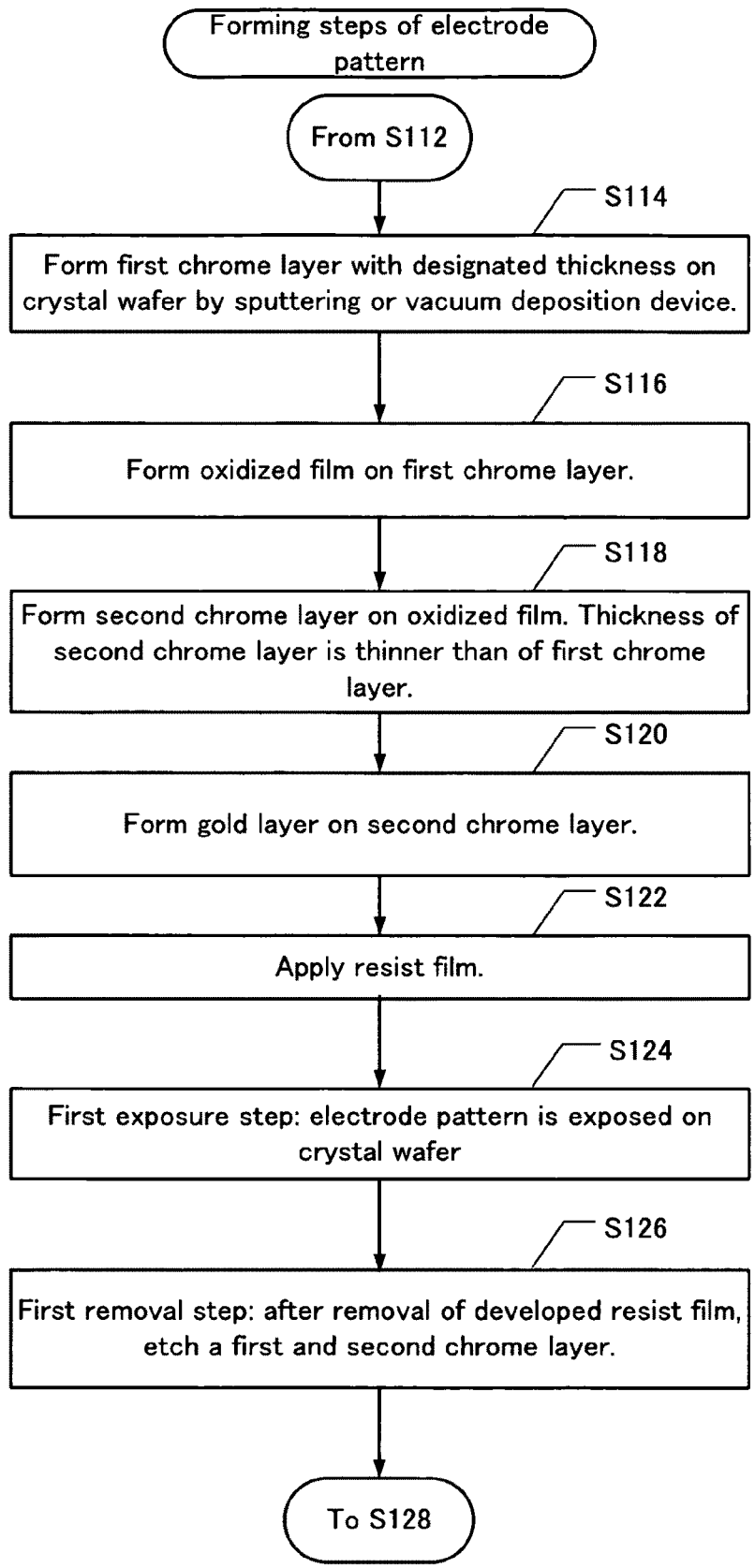
FIG. 4 is a flow-chart of electrode-pattern-forming steps of the method embodiment.
Figure 5:
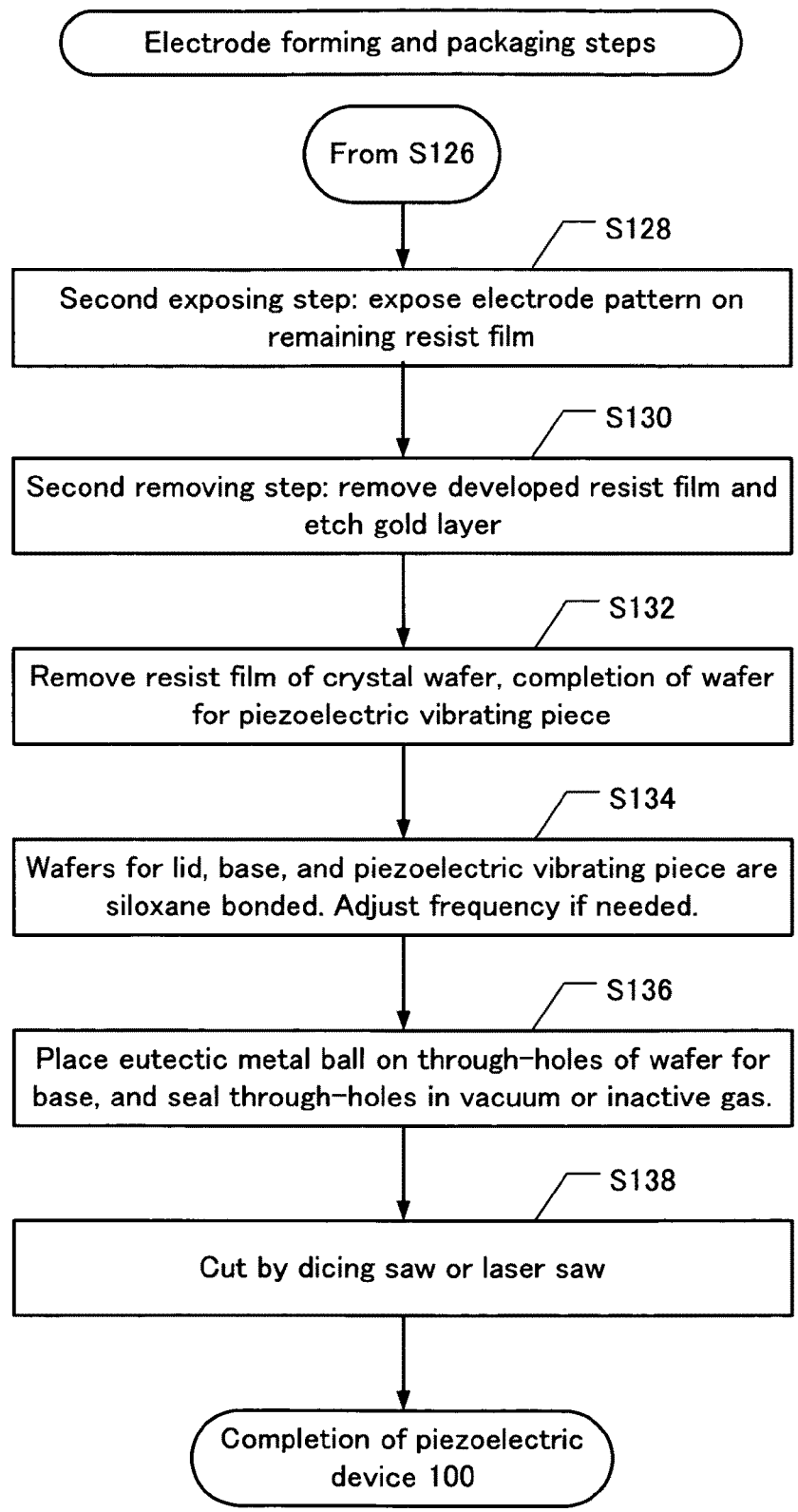
FIG. 5 is a flow-chart of electrode-formation and packaging steps of the method embodiment.

FIGS. 3 to 5 are respective flow-charts of respective portions of a manufacturing process for producing the embodiment of a piezoelectric device 100 shown in FIG. 1 using the piezoelectric crystal frame 20 shown in FIG. 2. FIG. 3 pertains to forming the profile of the piezoelectric vibrating piece. FIG. 4 pertains to forming the electrode patterns, and FIG. 5 pertains to forming electrodes and to packaging.

Forming the Profile of the Piezoelectric Vibrating Piece

Reference is made to FIG. 3. Step S102 is performed on a crystal wafer that has been ground and polished to a designated thickness and that has been surface-cleaned to remove contaminants. A corrosion-resistant film is formed on the entire surface of the crystal wafer by sputtering or vacuum deposition. On the surface of the crystal wafer, being a piezoelectric material, it is difficult to form a gold (Au) or silver (Ag) layer directly. Consequently, a layer of chromium (Cr) or titanium (Ti) is formed as a foundation layer. Then, a corrosion-resistant film is formed, for example a layer of gold on a layer of chromium.

In step S104 a photoresist film is applied evenly over the corrosion-resistant surface of the wafer by spin-coating or other suitable method. The photoresist can be, for example, novolak resin.

Next; in step S106, an exposure device (not shown) is used to expose the photoresist with the profile pattern. The pattern is exposed on both major surfaces of the crystal wafer to allow controlled wet-etching on both surfaces.

In step S108 the exposed photoresist layer is developed, followed by removal of the exposed photoresist. Regions of the gold layer now revealed by removal of the exposed photoresist are etched using an aqueous solution of iodine and potassium iodide. Then, regions of the underlying chrome layer revealed by removing corresponding portions of the gold layer are etched using, for example, an aqueous solution of ceric di-ammonium nitrate and acetic acid. The concentrations of these etchants, as well as the etching temperature and etching time, are controlled to avoid over-etch. Completion of etching results in complete removal of the corrosion-resistant film from the revealed regions. A structure is thus formed in which the crystal wafer 10 now defines the profile outline of the piezoelectric crystal frame 20 including the tuning-fork type crystal vibrating piece 30.

In step S110, regions of the crystal wafer 10 revealed by removal of the photo-resist film and corrosion-resistant film are etched using hydrofluoric acid, as the etchant, so as to form the three-dimensional profile of the piezoelectric crystal frame 20 including the tuning-fork type crystal vibrating piece 30. This wet-etching step takes about six to fifteen hours although it may be changed depending upon the concentration, types, and/or temperature of the hydrofluoric acid.

In step S112 the residual resist is removed as well as unneeded regions of the photo-resist and corrosion-resistant film.

Forming Electrode Pattern

Referring now to FIG. 4, steps for forming an electrode pattern are shown. In step S114, the piezoelectric crystal frame 20 is cleaned using purified water. Then, the first chromium layer is formed on the entire surface (both major surfaces) of the crystal wafer by sputtering, vacuum-deposition, or chemical vapor deposition. The first chromium layer is formed with a thickness in the range of 150 to 700 Ångstroms. Alternatively to chromium, a metal film of at least one of nickel (Ni), titanium (Ti), aluminum (Al), and tungsten (W) can be formed.

In step S116 the sputtering, vacuum deposition, or chemical vapor deposition device (not shown) is vented to atmospheric pressure to form an oxidized film on the first chromium layer. The first chromium layer with surficial oxidized-chromium film will be resistant to removal during a later step (step S130) in which gold is removed.

In step S118 a second chromium layer is formed on the oxidized-chromium film on both major surfaces. If a gold layer is formed on the oxidized-chromium film, the gold layer would not have sufficient adhesion strength to remain attached to the oxidized-chromium film, which may result in peeling of the gold layer. Hence the need for the second chromium layer, which desirably has a thickness in the range of 100 to 150 Ångstroms. The thickness of the second chromium layer can be less than of the first chromium layer.

In step S120 a gold layer, as a second metal film, is formed on the second chromium layer on both major surfaces. The gold layer desirably has a thickness in the range of 400 to 2000 Ångstroms. Instead of gold, the second metal film can be formed of silver (Ag). If the second metal film is made of silver, it is desirable that the silver layer be overlaid with a thin layer of gold to provide protection against oxidation.

In step S122 a photoresist film is applied by spin coating on both major surfaces of the crystal wafer, over the gold layer. Desirably the photoresist is a positive photoresist such as novolak resin.

In step S124 an exposure device (not shown) is used to perform a first exposure step in which the profile pattern of the piezoelectric vibrating piece, and frame, are formed. In this first exposure step, respective patterns are exposed on both major surfaces of the crystal wafer to allow wet-etching on both major surfaces.

Step S126 comprises developing the pattern-exposed photoresist layer and comprises a first removal step in which the exposed photoresist is removed. Portions of the gold layer now revealed by removal of the exposed photoresist are etched using an aqueous solution of iodine and potassium iodide. Then, portions of the underlying second chrome layer revealed by removing corresponding portions of the gold layer are etched by, for example, an aqueous solution of ceric di-ammonium nitrate and acetic acid. Etching slows when it encounters the oxidized film, but the concentrations of etchants, the etching temperature, and etching time are controlled so that etching can progress to the first chromium layer under the oxidized layer. Completion of etching results in complete removal of the first and second chromium layers from the revealed locations. Thus, a crystal wafer is formed that includes the profile of the piezoelectric crystal frame 20 and of the piezoelectric vibrating piece, and that includes the electrodes such as the excitation and extraction electrodes.

FIG. 5 is a flow-chart of steps for forming the remaining electrodes and for forming a packaged piezoelectric device. In step S128 a second exposure step is performed to expose the photoresist film remaining on the electrode patterns after the first removal step. The exposure forms, in the remaining photoresist, a patterned photo-mask for exposing profiles of the first and second extraction electrodes 31, 32. Respective patterns are exposed on both major surfaces of the crystal wafer to allow wet-etching of both major surfaces.

In step S130 the pattern-exposed photoresist layer is developed, followed by a second removal step in which the exposed photoresist is removed. In the second removal step, portions of the gold layer now revealed by removal of the exposed photoresist are etched using an aqueous solution of iodine and potassium iodide. It is possible for chromium in the second chromium layer to diffuse into the gold layer formed on the second chromium layer; also, gold may diffuse into the second chromium layer. Thus, when the gold layer is etched, the chromium of the second chromium layer that has diffused into the gold layer is also etched. As a result, despite the second chromium layer being formed with a thickness in the range of 100 to 150 Ångstroms, the second chromium layer may undesirably be only 10 to 30 Ångstroms thick after etching the gold layer.

However, because of the oxidized film formed on the first chromium layer, the chromium in the first chromium layer does not diffuse in the gold layer. Also, even after the gold layer is etched, the thickness of the first chromium layer is maintained at a thickness in the range of 150 to 700 Ångstroms. This range of thickness allows good connections from the first and second connecting terminals 35, 36 to the first and second excitation electrodes 33, 34, respectively. Consequently, although the gold layer is removed in the second removal step, the first chrome layer is retained with a designated thickness, which prevents breakage of the conductors of the first and second extraction electrodes 31, 32.

In step S132 unneeded photoresist film is removed, thereby completing manufacture of a crystal wafer comprising many identical piezoelectric crystal frames 20 and vibrating pieces with respective electrodes.

In step S134 the crystal wafer on which the piezoelectric crystal frames 20 are formed, the crystal wafer on which the package bases 40 are formed, and the crystal wafer on which the lids 10 are formed are formed into a sandwich and bonded together by siloxane bonding. The bonding surfaces of each of the three wafers are mirror-finished and then activated by exposure to a plasma or irradiating ion beam. To form the sandwich, the three wafers are aligned with each other and simultaneously heated to a temperature in the range of 100° C. to 200° C. and pressurized while maintaining this temperature. The three wafers then are bonded together using a siloxane bonding method. As shown in FIG. 1, during siloxane bonding, the first connecting electrode 42 and first external electrode 45 are electrically connected together, and the second connecting terminal 36 is electrically connected to the second connecting electrode 44 and the second external electrode 46.

Trimming a part of the connecting portion 26 to a desired width in the Y-direction is performed using a femtosecond laser FL, thereby changing the vibrational frequency. The connecting portions 26 are trimmed to a desired width to provide the desired oscillation frequency.

In step S136 the 3-wafer sandwich of bonded wafers are put into a vacuum or inert gas environment. Then, the through-holes TH are sealed using the eutectic alloy 70. Completion of this step completes formation of the package 80.

The through-holes TH are sealed using the eutectic alloy 70. Specifically, a unit of the eutectic alloy, having a ball shape, is placed on each of the through-holes TH. The eutectic alloy 70 is heated in a vacuum reflow furnace providing a high vacuum or inert-gas environment for the designated time. With $Au_{12}Ge$ alloy, for example, the vacuum reflow oven provides a vacuum or inert gas environment at 400° C. to seal the through-holes. With $Au_{40}Sn$ alloy, as another example, the vacuum reflow oven provides a vacuum or inert gas environment at 300° C. to seal. After completing this process (FIGS. 3-5), piezoelectric devices 100 are produced in which the interior of the package 80 contains a vacuum or inert-gas atmosphere.

In step S138, the sandwich is cut using a dicing saw or pulsatile laser to produce the first piezoelectric devices 100 in which the package interiors provide a vacuum atmosphere. To such end, the sandwich, in which the individual packages contain a vacuum or an inert gas, is cut up using a dicing saw or laser, thereby completing production of individual piezoelectric devices 100. The piezoelectric device 100 comprises excitation electrodes that include the first chromium layer, the second chromium layer as a foundation layer, and the gold layer. Consequently, the piezoelectric devices 100 exhibit low CI values. Also, the vibrating frequency of the devices is easy to adjust and is stable.

Second Embodiment of Piezoelectric Crystal Frame and Device

Figure 6:
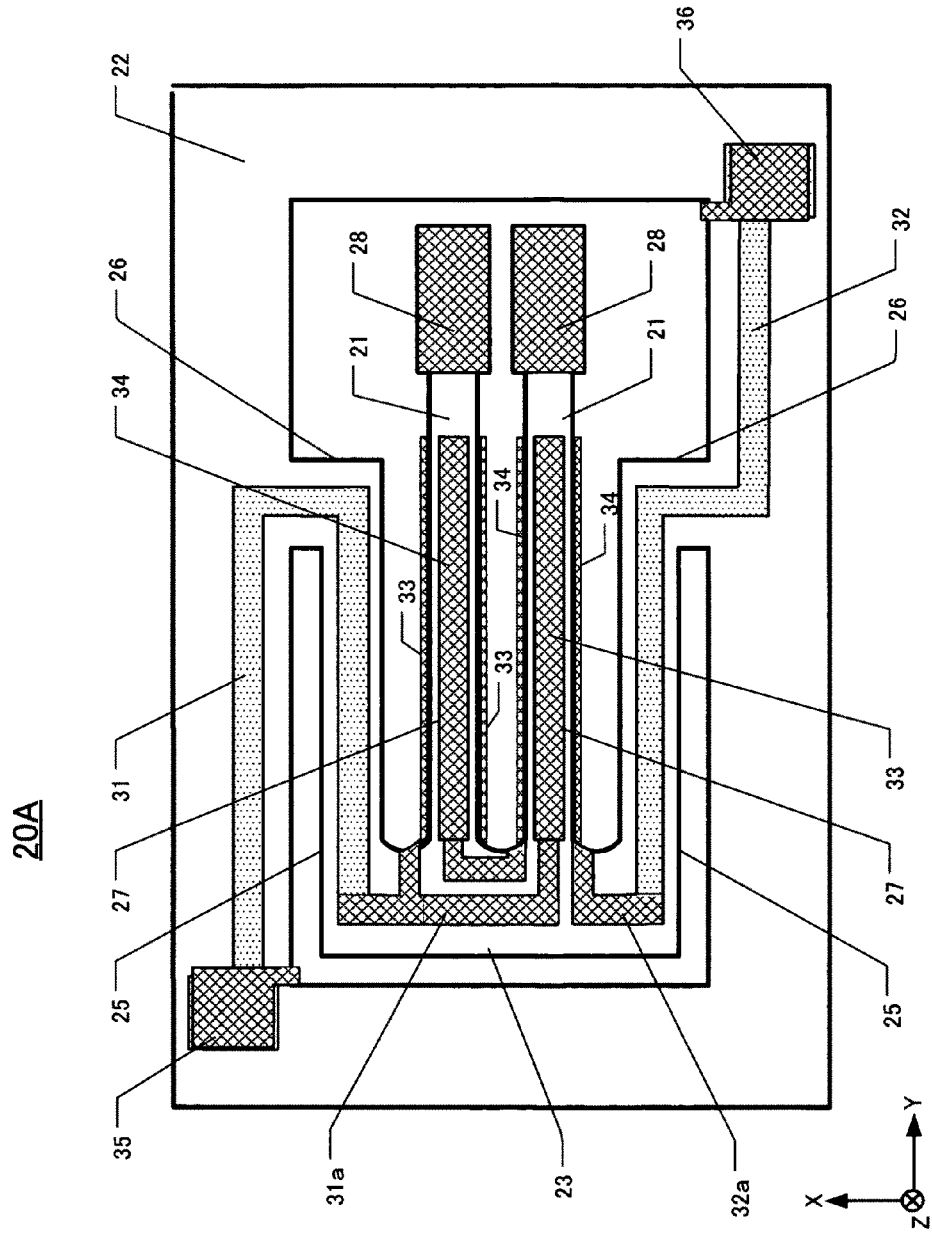
FIG. 6 is a plan view of a piezoelectric crystal frame according to a second embodiment.

FIG. 6 is a plan view of a second embodiment of a piezoelectric crystal frame 20A. Extraction electrodes 31a, 32a, each including a gold layer, are formed on portions of the first and second extraction electrodes 31, 32 of the base 23 in the first embodiment. This electrode configuration represents a change from the first embodiment. In the second embodiment, components that are the same as in the first embodiment have the same respective reference numerals and are not described further below; only differences are described below.

To form the gold-layered extraction electrodes 31a, 32a on the base 23, an oxidized film is formed on the first chromium layer (the latter having a thickness in the range of 150 to 700 Ångstroms) on both major surfaces of the crystal wafer. A thin second chromium layer is formed on the oxidized film, and a gold (Au) layer (having a thickness in the range of 400 to 2000 Ångstroms) is formed on the second chromium layer. Although the gold layer of the first chromium layer of the first and second extraction electrodes 31, 32 is removed in the second removal step described in step S130 of FIG. 5, the first chromium layer remains having a designated thickness, which prevents fracture of conductors. Note that, when the first and second extraction electrodes 31, 32 are comprised of a first chromium layer and an oxidized film, diffusion of germanium and flow of gold is stopped. I.e., the germanium component of the eutectic alloy 70 does not diffuse to the first and second excitation electrodes 33, 34, and the gold component of the first and second excitation electrodes 33, 34 does not flow to the eutectic alloy 70 because the gold layer does not exist.

The second piezoelectric crystal frame 20A is manufactured largely according to the steps shown in FIGS. 3-5. The second piezoelectric device 110 has one principal difference compared to the first embodiment. This difference pertains to areas in which the gold layer is removed in step S130 of FIG. 5; the other steps are the same. In the third to fifth embodiments described below, the manufacturing steps are the same.

Third Embodiment of Piezoelectric Frame and Piezoelectric Device

Figure 7:
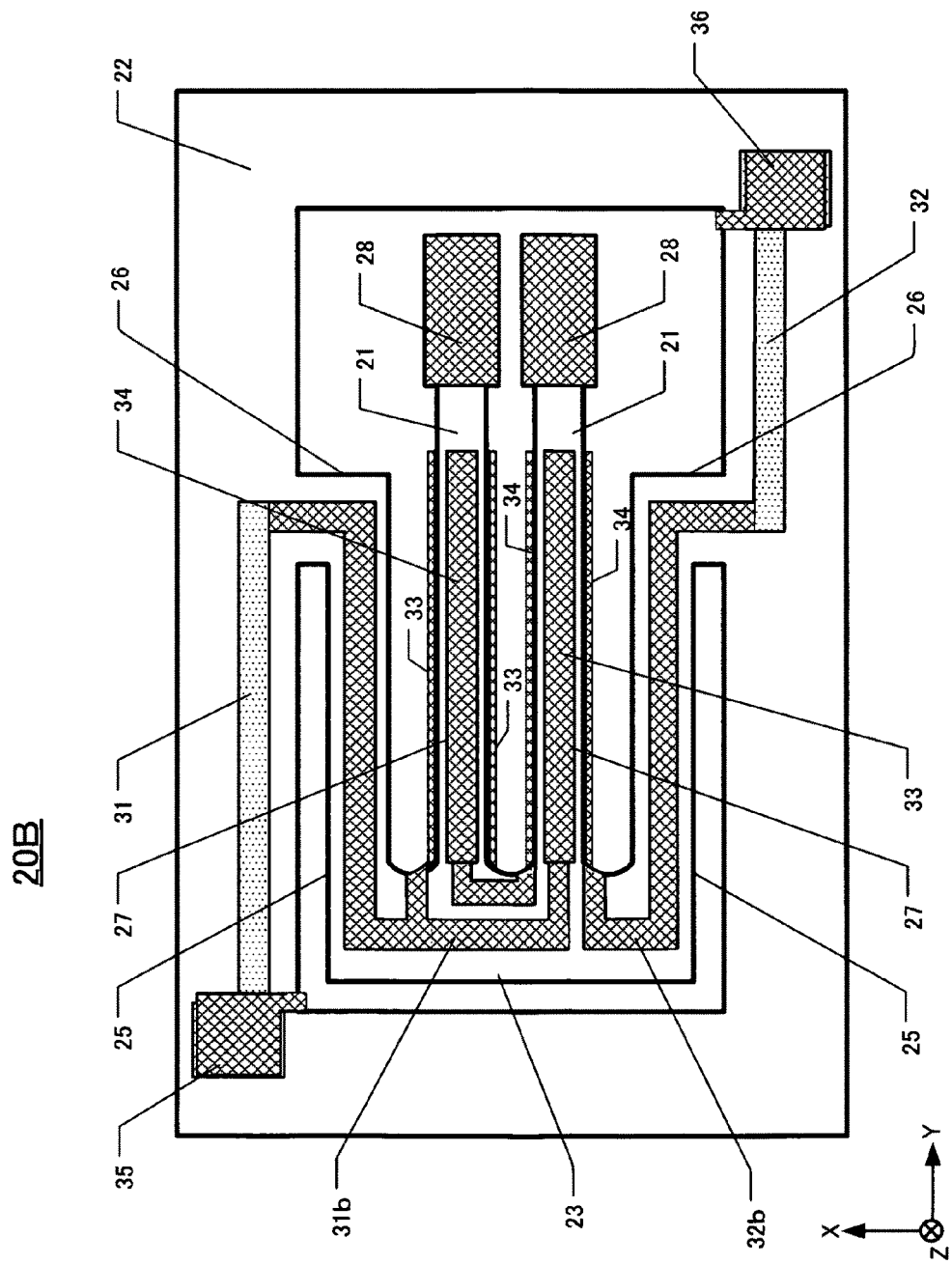
FIG. 7 is a plan view of a piezoelectric crystal frame according to a third embodiment.

FIG. 7 is a plan view of a third embodiment of a piezoelectric crystal frame 20B. In this embodiment, gold-layered extraction electrodes 31b, 32b are formed on the base 23, on the supporting arms 25, and on the connecting portions 26 of the first and second extraction electrodes 31, 32. This is a different distinction from first and second embodiments. In this embodiment, components that are the same as corresponding components of the first embodiment have the same respective reference numerals and are not described further below; only distinctions are described.

Regarding the gold-layered extraction electrodes 31b, 32b formed on the base portion 23, the supporting arms 25, and the connecting portions 26, an oxidized film is formed on the first chromium layer, the latter having a thickness in the range of 150 to 700 Ångstroms. A thin second chromium layer is formed on the oxidized film, and a gold (Au) layer having a thickness in the range of 400 to 2000 Ångstroms is formed on the second chromium layer. Although the gold layer of the first chromium layer of the first and second extraction electrodes 31, 32 is removed in the second removal step described in step S130 of FIG. 5, the thickness of first chromium layer is preserved at a designated thickness, which prevents fracture of conductors.

Fourth Embodiment of Piezoelectric Frame and Piezoelectric Device

Figure 8:
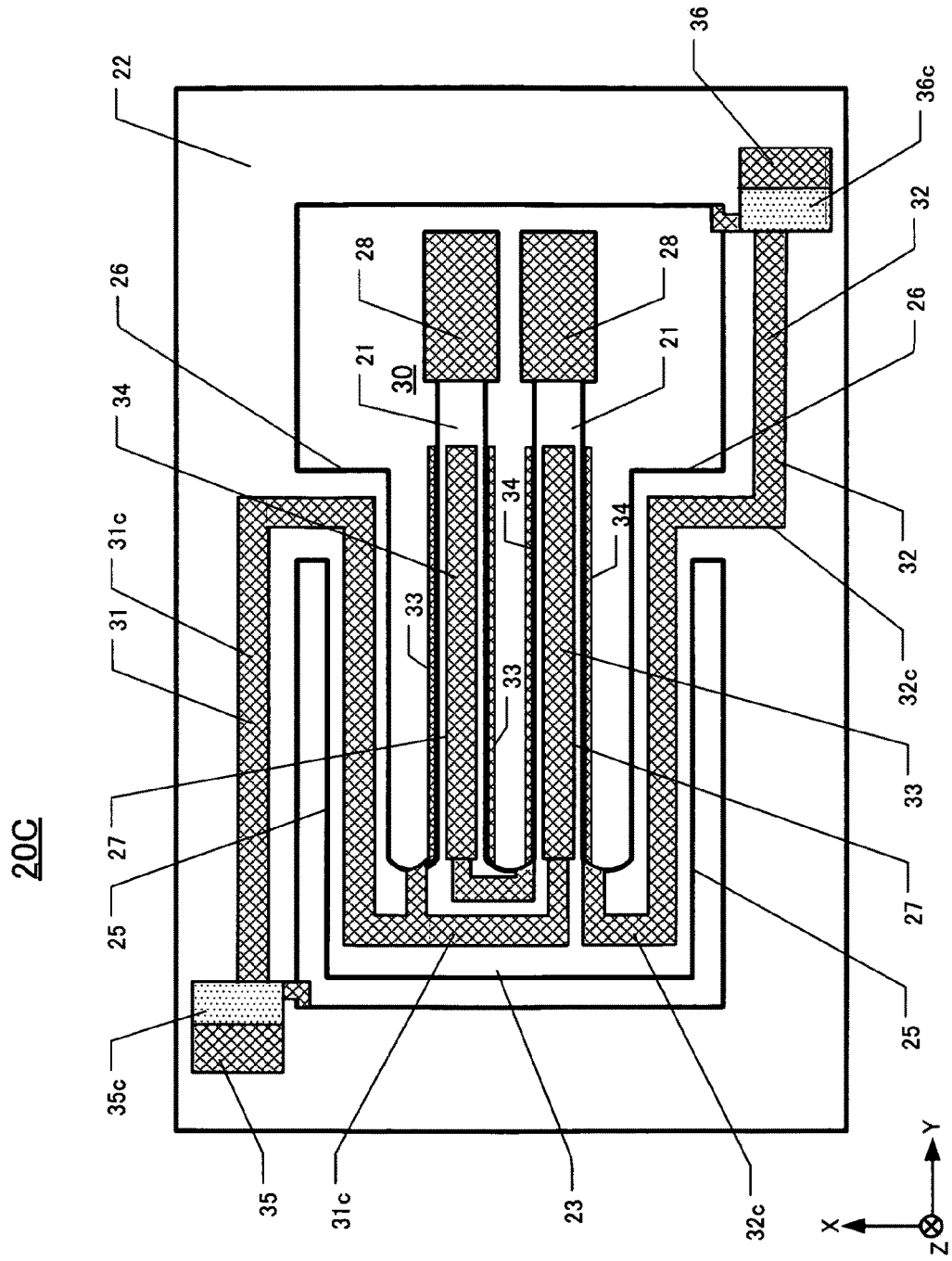
FIG. 8 is a plan view of a piezoelectric crystal frame according to a fourth embodiment.

FIG. 8 is a plan view of a fourth embodiment of a piezoelectric crystal frame 20C. In the fourth embodiment, gold-layered extraction electrodes 31b, 32b are formed on the base 23, the supporting arms 25, the connecting portions 26, and the frame portion 22 of the first and second extraction electrodes 31, 32. This is a distinction from the first, second, and third embodiments. On the other hand, half of the first and second connecting terminals 35, 36 include a first chromium layer and an oxidized film. These halves are denoted in FIG. 8 as first and second connecting terminals 35c, 36c. In this embodiment, components that are similar to corresponding components of the first embodiment have the same reference numerals and are not described further; only the distinctions are described below.

Regarding the gold-layered extraction electrodes 31b, 32b formed on the base 23, the supporting arms 25, the connecting portions 26, and the crystal-frame portion 22, an oxidized film is formed on a first chromium layer. A thin second chromium layer is formed on the oxidized layer, and a gold (Au) layer is formed on the second chromium layer. The first and second connecting terminals 35c, 36c near the gold-layered extraction electrodes 31c, 32c include a first chromium layer and an oxidized film. With this configuration, diffusion of germanium components and flow of gold components are prevented. I.e., germanium components do not diffuse to the first and second excitation electrodes 33, 34, and gold components of the first and second excitation electrodes 33, 34 do not flow out.

Fifth Embodiment of Piezoelectric Frame and Piezoelectric Device

Figure 9:
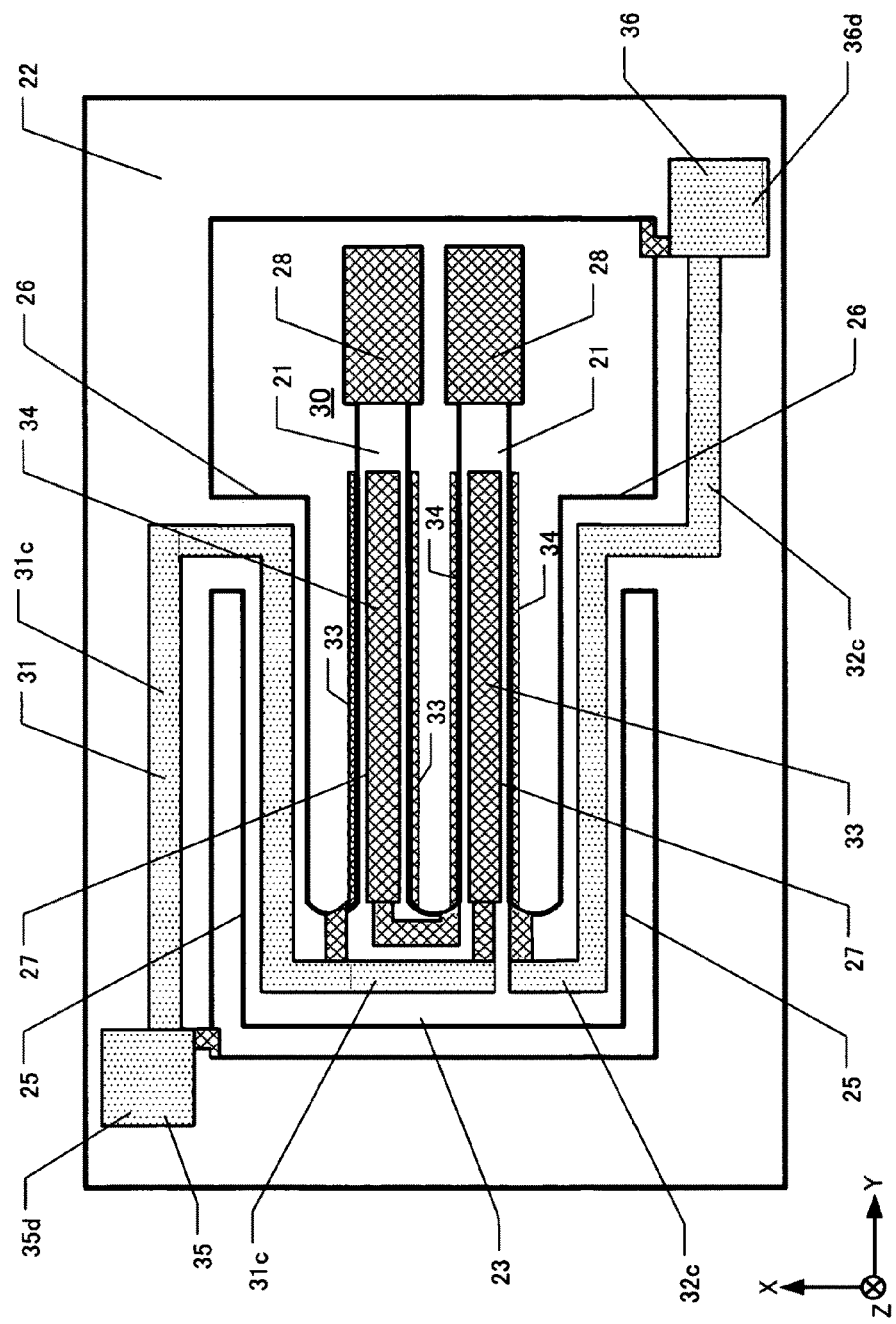
FIG. 9 is a plan view of a piezoelectric crystal frame according to a fifth embodiment.

FIG. 9 is a plan view of this embodiment of a piezoelectric crystal frame 20D. In this embodiment, gold-layered extraction electrodes 31c, 32c including a gold layer are formed on the first and second extraction electrodes 31, 32 of the base 23. A first chromium layer and an oxidized film are formed from the first and second connecting terminals 35, 35d, 36d to the first and second extraction electrodes 31, 32 of the base 23.

Since the first chromium layer and oxidized film are formed from the first and second connecting terminals 35, 36 to the first and second extraction electrodes 31, 32 of the base portion 23, germanium components do not diffuse, and gold components do not flow. I.e., germanium components do not diffuse to the first and second excitation electrodes 33, 34, and gold components of the first and second excitation electrodes 33, 34 do not flow out.

The invention has been described above in the context of preferred embodiments. It will be understood that those of ordinary skill in the art can vary and/or modify the invention within the scope of this invention. For example, for the piezoelectric crystal frame 20 including a tuning-fork type piezoelectric vibrating piece 21, various kinds of piezoelectric single-crystal materials can be used instead of quartz crystal, such as lithium niobate. Also, instead of siloxane bonding, the lid and package base can be bonded to the crystal wafer by anodic bonding, for example.

Further, this invention can be applied to a piezoelectric vibrating device in which a different configuration of tuning-fork type crystal vibrating piece is contained in the package. That is, instead of the crystal frame having supporting arms and an outer frame as shown in FIG. 2, this invention can be applied to a tuning-fork type crystal vibrating piece itself.

What is claimed is:

1. A tuning-fork type piezoelectric vibrating piece, comprising:
a base having a proximal edge, a distal edge, and opposing side edges;
a pair of vibrating arms extending in a longitudinal direction from the distal edge;
respective excitation electrodes situated on the vibrating arms;
extraction electrodes situated on the base and connected to respective excitation electrodes: and
connecting terminals connected to respective extraction electrodes and comprising a eutectic alloy, wherein
the excitation electrodes, extraction electrodes, and connecting terminals comprise (i) a first metal layer consisting of a metal selected from the group consisting of Cr, Ni, Ti, Al, and W, (ii) an oxide layer of an oxidized form of the metal of the first metal layer, (iii) a foundation layer consisting of a metal selected from the group consisting of Cr, Ni, Ti, Al, and W formed on the oxide layer, and (iv) a second metal layer consisting of a metal selected from the group consisting of Au and Ag formed on the foundation layer, wherein a portion of the second metal layer is removed at designated loci on the extraction electrodes so that the second metal layer on the excitation electrode and the second metal layer on the connecting terminals are not formed as one connected metal film.

2. A piezoelectric device, comprising;
a piezoelectric vibrating piece as recited in claim 1;
an outer frame surrounding the base and vibrating arms:
a lid bonded to a first major surface of the outer frame; and
a package base bonded to a second major surface of the outer frame.

3. The vibrating piece of claim 1, further comprising:
a respective supporting arm extending, outboard of each vibrating arm, from each side edge of the base; and
an outer frame surrounding the base, vibrating arms, and supporting arms, wherein
the supporting arms are connected to the outer frame, and
the extraction electrodes are formed on the respective supporting arms and the outer frame, and the connecting terminals are formed on the outer frame.

4. A piezoelectric device, comprising;
a piezoelectric vibrating piece as recited in claim 3;
an outer frame surrounding the base and vibrating arms;
a lid bonded to a first major surface of the outer frame; and
a package base bonded to a second major surface of the outer frame.

5. The vibrating piece of claim 1, wherein the second metal layer is removed at the connecting terminals.

6. A piezoelectric device, comprising;
a piezoelectric vibrating piece as recited in claim 5;
an outer frame surrounding the base and vibrating arms;
a lid bonded to a first major surface of the outer frame; and
a package base bonded to a second major surface of the outer frame.

7. A tuning-fork type piezoelectric vibrating piece, comprising:
a base having a proximal edge, a distal edge, and opposing side edges;
a pair of vibrating arms extending in a longitudinal direction from the distal edge;
respective excitation electrodes situated on the vibrating arms;
respective extraction electrodes situated on the base and connected to the excitation electrodes; and
connecting terminals electrically connected to respective extraction electrodes and being situated on the base, the supporting arms, and the outer frame; wherein
the excitation electrodes, extraction electrodes, and connecting terminals comprise (i) a first metal layer consisting of a metal selected from the group consisting of Cr, Ni, Ti, Al, and W, (ii) an oxide layer of an oxidized form of the metal of the first metal layer, (iii) a foundation layer consisting of a metal selected from the group consisting of Cr, Ni, Ti, Al, and W formed on the oxide layer, and (iv) a second metal layer consisting of a metal selected from the group consisting of Au and Ag formed on the foundation layer, wherein a portion of the second metal layer is removed at the connecting terminals and at loci on the extraction electrodes adjacent the connecting terminals, so that the second metal layer on the excitation electrodes and the second metal layer on the connecting terminals are not formed as a single connected metal film.

8. A piezoelectric device, comprising;
a piezoelectric vibrating piece as recited in claim 7;
an outer frame surrounding the base and vibrating arms;
a lid bonded to a first surface of the outer frame; and
a package base bonded to a second major surface of the outer frame.

* * * * *